United States Patent
Schneider

(10) Patent No.: US 11,050,369 B2
(45) Date of Patent: Jun. 29, 2021

(54) ARRANGEMENT FOR TRANSMITTING DESIRED VALUE SIGNALS FOR AN ELECTRONICALLY COMMUTATED MOTOR

(71) Applicant: ebm-papst Mulfingen GmbH & Co. KG, Mulfingen (DE)

(72) Inventor: Fabian Schneider, Rot am See (DE)

(73) Assignee: ebm-papst Mulfingen GmbH & Co. KG, Mulfingen (DE)

(*) Notice: Subject to any disclaimer, the term of this patent is extended or adjusted under 35 U.S.C. 154(b) by 0 days.

(21) Appl. No.: 16/775,347

(22) Filed: Jan. 29, 2020

(65) Prior Publication Data
US 2020/0169197 A1    May 28, 2020

Related U.S. Application Data

(63) Continuation of application No. PCT/EP2018/071013, filed on Aug. 2, 2018.

(30) Foreign Application Priority Data

Aug. 30, 2017 (DE) .................. 10 2017 119 947.0

(51) Int. Cl.
*H02P 6/14*      (2016.01)
*G08C 23/04*    (2006.01)

(52) U.S. Cl.
CPC ............ *H02P 6/14* (2013.01); *G08C 23/04* (2013.01)

(58) Field of Classification Search
CPC .................... H02P 6/14; G08C 23/04
See application file for complete search history.

(56) References Cited

U.S. PATENT DOCUMENTS 3,582,767 A * 6/1971 Brum .................. G01N 27/045
                                                          324/442
4,005,387 A * 1/1977 Herring ................. G05B 19/04
                                                          700/10
(Continued)

FOREIGN PATENT DOCUMENTS

| DE | 297 01 571 U1 | 4/1997 |
| EP | 1 662 665 A1 | 5/2006 |
| EP | 2 840 708 A2 | 2/2015 |

OTHER PUBLICATIONS

International Search Report and Written Opinion (in German) dated Oct. 25, 2018 in corresponding PCT Application No. PCT/EP2018/071013.

*Primary Examiner* — Bentsu Ro
(74) *Attorney, Agent, or Firm* — Harness, Dickey & Pierce, P.L.C.

(57) ABSTRACT

An arrangement (1) with an electronically commutated motor has an interface (10) for inputting analog setpoint signals (S) for the motor. The motor is powered, during operation, by an AC network via an electronic commutation system (20). The interface (10) is galvanically isolated from the electronic commutation system (20) by a galvanic isolation (30). Furthermore, for the transmission of an analog setpoint signal (S), a bitstream signal production device (2) is provided on the galvanically isolated interface side. Also provided is a transmission device (3), for transmitting the produced bitstream, as well as a signal-processing device (4). They are on the non-galvanically isolated side for the signal evaluation of the bitstream.

8 Claims, 1 Drawing Sheet

(56) References Cited

U.S. PATENT DOCUMENTS

| | | | | |
|---|---|---|---|---|
| 5,455,764 | A | * | 10/1995 | Meihofer ................ B26D 5/32 101/248 |
| 6,100,510 | A | * | 8/2000 | Chen .................... H05B 1/0247 219/481 |
| 2016/0056829 | A1 | | 2/2016 | Glibbery et al. |

\* cited by examiner

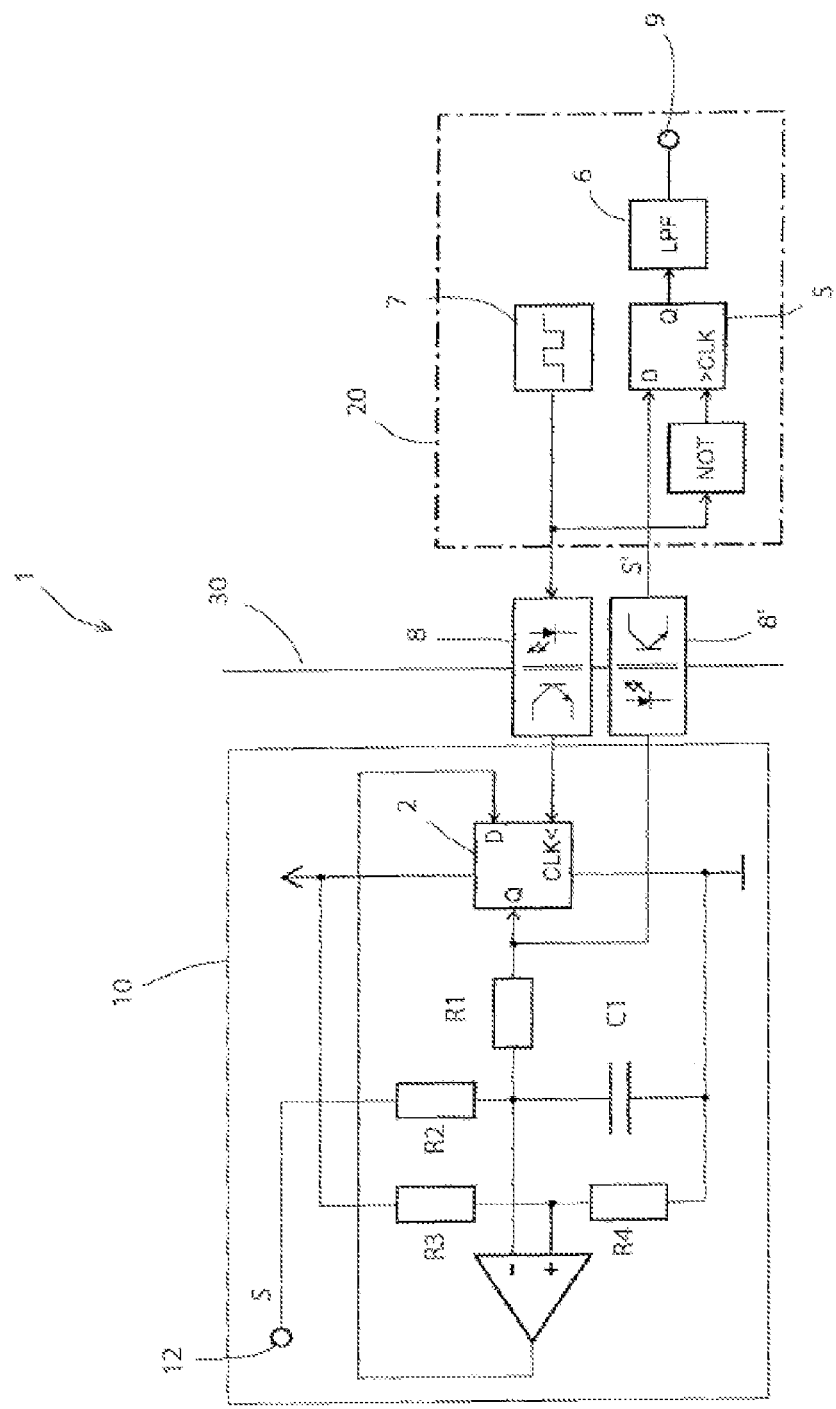

ARRANGEMENT FOR TRANSMITTING DESIRED VALUE SIGNALS FOR AN ELECTRONICALLY COMMUTATED MOTOR

CROSS-REFERENCE TO RELATED APPLICATIONS

This application is a continuation of International Application No. PCT/EP2018/071013, filed Aug. 2, 2018, which claims priority to German Application No. 10 2017 119 947.0, filed Aug. 30, 2017. The disclosures of the above applications are incorporating herein by reference.

FIELD

The disclosure relates to an arrangement with an electronically commutated motor, that is powered during operation by an AC network via commutation electronics. It has an interface for the input of setpoint signals for the motor. The interface is galvanically isolated from the commutation electronics.

BACKGROUND

If no transformer is provided between the electronically commutated motor (EC motor) and the AC network, the EC motor is not galvanically isolated from the AC network. This requires special protective measures in the event of insulation damage, or the like.

For this purpose, a galvanic isolation is provided in the prior art between an interface for setpoint specification, also referred to as customer interface or user interface, and the commutation electronics. The prior art teaches a concept with an arrangement consisting of an electronically commutated motor. While in operation, it is provided with voltage from an AC network, via a connected rectifier. A DC intermediate circuit is connected to the rectifier. An arrangement is fed, via a transformer, from the AC network. The arrangement supplies electronic elements of the motor with DC voltage. A user interface is provided to transmit information from or to the motor. The interface is galvanically isolated from the motor and is assigned to a power supply that is galvanically isolated from the motor.

The galvanic isolation ensures that the user interface is isolated from the motor. Thus, the AC network, according to its electrical potential, excludes risk even in case of faults or damage to the motor.

From the user interface, an analog input signal may be transmitted as a pulse-width modulated signal from the user interface to the motor, via an isolating transformer, an optical fiber, or an optical coupler. Thus, for example, an analog signal for the desired speed may be fed to the user interface. This analog signal, within the user interface, can be converted to digital signals with a signal-dependent duty cycle. These digital signals may be transmitted to the control electronics of the motor by an optical coupler for further processing.

Usually, such an analog setpoint signal is initially converted to a digital signal by a microcontroller or an IC on the side of the customer interface, that is galvanically isolated from the AC network. The signal is then transmitted, via the galvanic isolation, and evaluated on the commutation side by a second microcontroller (commutation controller). The signal transmitted via the isolating path is usually a PWM signal. The information of the analog setpoint is contained in the pulse width of the signal. It is proportional to the analog value. In the case of transmission using low-cost optical couplers, the signal propagation times (dead-time transmission) effect a change in the pulse/pause ratio. The change in the pulse duration over the pause duration of the PWM signal corrupts the information contained in the pulse width. Thus, the transmission accuracy is influenced by the signal propagation times and the resulting change in the pulse-pause ratio.

The signal propagation times of the transmission path (optical coupler[s]) are also influenced by other factors, as well as by being highly influenced by the temperature and the aging of the component. Generally, this gives rise to an incorrect or inaccurate analog setpoint influence for the device.

Therefore, there is a need to improve the transmission accuracy when transmitting an analog setpoint signal for an EC motor from an existing interface for analog setpoint specifications to the commutation electronics with galvanic isolation.

SUMMARY

The object of the disclosure is to overcome the aforesaid drawback. The disclosure provides a device with a high level of electrical safety. Furthermore, it ensures that the setpoint specifications are transmitted to the motor with high accuracy.

This object is achieved by an arrangement with an electronically commutated motor has an interface for inputting analog setpoint signals (S) for the motor. The motor is powered, during operation, by an AC network via an electronic commutation system. The interface is galvanically isolated from the electronic commutation system by a galvanic isolation. Furthermore, for the transmission of an analog setpoint signal (S), a bitstream signal production device is provided on the galvanically isolated interface side. Also provided is a transmission device, for transmitting the produced bitstream, as well as a signal-processing device. They are on the non-galvanically isolated side for the signal evaluation of the bitstream.

A fundamental idea of this disclosure is to no longer transmit the analog setpoint value as a PWM signal over the isolating distance, where the information is contained in the pulse width. Here, a discrete circuit is used on the galvanically isolated interface side. The analog signal is converted to a bitstream, transmitted and evaluated time-discretely on the commutation side, and reconverted to a value proportional to the analog setpoint value.

This removes the problems related to the signal propagation times. The pulse-pause ratio is therefore no longer relevant and the transmission accuracy becomes independent of the signal propagation time. The clock signal required for the conversion on the galvanically isolated interface side is generated on the non-isolated commutation side. This enables simple synchronization of the time-discrete evaluation to the bitstream with maximum precision.

Thus, according to the disclosure, an arrangement is provided with an electronically commutated motor with an interface for inputting analog setpoint signals for the motor. The motor is powered during operation by an AC network via commutation electronics. The interface is isolated from the commutation electronics by galvanic isolation. A signal-generating device is provided on the galvanically isolated interface side for transmission of an analog setpoint signal and a bit stream. Also provided is a transmission device to transmit the generated bitstream. A signal-processing device is provided on the galvanically non-isolated side for signal evaluation of the bitstream.

In a preferred embodiment of the disclosure, the bitstream signal-generating device on the galvanically isolated interface side is a D flip-flop, an integrator, and a comparator.

In a similarly advantageous embodiment of the disclosure, the transmission device for the bitstream is an optical coupler. Advantageously, very inexpensive, slow optical couplers may be used.

Furthermore, it is advantageous that the signal-processing device on the galvanically non-isolated side is a D flip-flop, an oscillator, an inverter and a low-pass filter. The bitstream is evaluated using a microcontroller. Particularly advantageously, a microcontroller prevalent in commutation electronics may also be used for this purpose.

In order to generate a time-discrete bitstream from the analog setpoint signal, a module for generating a clock signal on the galvanically non-isolated side is provided. It converts the analog setpoint signal to a bitstream signal by the clock signal.

It may also be provided that the signal-processing device is designed to evaluate the time-discrete bitstream signal and convert it to a value. The valve is proportional to the analog signal value for the motor.

Another aspect of the present disclosure relates to a method for transmitting an analog setpoint signal from an interface past a galvanic isolation to an electronically commutated motor with a device described above, comprising the following steps of:
 a. Generating a bitstream on the galvanically isolated side of the device;
 b. Transmitting the generated digital bitstream past the galvanic isolation; and
 c. Clock generating and evaluating the bitstream on the galvanically non-isolated side for supplying the obtained signal to the motor.

A preferred embodiment of the method provides that the bitstream is generated in the aforementioned step a) by a D flip-flop, an integrator, and a comparator. It is also advantageous using an optical coupler to transmit the bitstream in step b.

The signal evaluation on the galvanically non-isolated side may advantageously be carried out by a D flip-flop, an oscillator, an inverter, a low-pass filter, or a microcontroller.

Other advantageous developments of the disclosure are indicated in the subclaims, or described in more detail below, along with the description of the preferred embodiment of the disclosure with reference to the figures.

DRAWINGS

Further features and advantages of the disclosure result from the following description of exemplary embodiments with reference to the appended drawings. The following is shown:

FIG. 1 is a block diagram of the device according to the disclosure.

DETAILED DESCRIPTION

The block diagram in FIG. 1 shows an arrangement 1 for an electronically commutated motor (not shown) with an interface 10 for inputting analog setpoint signals S for the motor. It is powered by an AC network via commutation electronics 20 during operation. The interface 10 is galvanically isolated from the commutation electronics 20 by the galvanic isolation 30, shown in the middle.

The customer interface 10 includes a flip-flop 2 to generate a bitstream from an analog setpoint signal S. The setpoint signal S is provided at the analog setpoint input 12. Here, the flip-flop 2 operates as an element of the bitstream signal-generating device on the galvanically isolated interface side.

A transmission device 3 is shown in the area of the galvanic isolation 30 for transmitting the generated bitstream past the galvanic isolation 30 to the commutation electronics 20. The commutation electronics 20 includes a signal-processing device 4, a flip-flop 5, and a low-pass filter 6. The signal processing device 4 further includes an electronic module 7 for generating a clock signal. The clock signal, as indicated by the arrow in FIG. 1, is transmitted via an optical coupler 8 to the flip-flop 2. The clock signal is transmitted against the signal path for the analog signal, in order to generate a bitstream in the form of a time-discrete signal. This signal is also transmitted to the flip-flop 5 via the low-pass filter 6 to output 9 via the optical coupler 8' past the galvanic isolation 30 for time-discrete signal evaluation.

At output 9 of the signal processing device 4 on the galvanically non-isolated side of the motor, signal S', which is proportional to the analog signal S, is provided for an electronically commutated motor following the time-discrete signal evaluation.

In addition to the described exemplary embodiment, a number of variants are conceivable that make use of the depicted solution even for fundamentally different types of embodiments. The evaluation of the clocked signal following the bitstream signal generation on the galvanically non-isolated side may also be done by use of an appropriately designed microcontroller.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An arrangement having an electronically commutated motor comprising:
 an interface for inputting analog setpoint signals (S) for the motor, the motor is powered during operation by an AC network via commutation electronics;
 the interface is electrically isolated from the commutation electronics by a galvanic separation;
 a bitstream signal-generating device for transmitting an analog setpoint signal (S) is provided on the galvanically isolated interface side;
 a transmission device for transmitting the generated bitstream along with a signal processing device are provided on the galvanically non-isolated side for signal evaluation of the bitstream; and
 the signal processing device is designed to evaluate the time-discrete bitstream signal and convert it, for the motor, into a value that is proportional to the analog signal value, and wherein, for generating a time-discrete bitstream from the analog setpoint signal (S), a module for generating a clock signal on the galvanically non-isolated side is provided in order to convert the analog setpoint signal (S) into a time-discrete bitstream signal by the clock signal.

2. The arrangement according to claim 1, wherein the bitstream signal-generating device on the galvanically isolated interface side is a D flip-flop, an integrator, and a comparator.

3. The arrangement according to claim 1, wherein the transmission device for the bitstream is an optical coupler.

4. The arrangement according to claim 1, wherein the signal processing device on the galvanically non-isolated side is a D flip-flop, an oscillator, an inverter, and a low-pass filter, or is realized by a microcontroller.

5. A method for transmitting an analog setpoint signal (S) from an interface past a galvanic isolation to an electronically commutated motor having an arrangement according claim, comprising the steps of:
   a. Generating a bitstream on the galvanically isolated side of the arrangement;
   b. Transmitting the generated digital bitstream via the galvanic isolation;
   c. Clock generating and evaluating the bitstream on the galvanically non-isolated side; and
   d. Supplying the resulting signal to the motor.

6. The method according to claim 5, wherein in step a) the bitstream is generated by a D flip-flop, an integrator, or a comparator.

7. The method according to claim 5, wherein an optical coupler is used for transmitting the bitstream.

8. The method according to claim 5, wherein the signal evaluating is carried out on the galvanically non-isolated side by a D flip-flop, an oscillator, an inverter, a low-pass filter or by a microcontroller.

\* \* \* \* \*